United States Patent [19]

Laass

[11] Patent Number: 4,947,110
[45] Date of Patent: Aug. 7, 1990

[54] TEST APPARATUS TO CHECK CONDITIONS AND CHARACTERISTICS OF POWER AND COMMUNICATION NETWORKS

[75] Inventor: Heinz Laass, Pfungstadt, Fed. Rep. of Germany

[73] Assignee: TACO Tafel GmbH, Esslingen, Fed. Rep. of Germany

[21] Appl. No.: 305,300

[22] Filed: Feb. 1, 1989

[30] Foreign Application Priority Data

Feb. 24, 1988 [DE] Fed. Rep. of Germany ....... 3805755
Oct. 14, 1988 [DE] Fed. Rep. of Germany ....... 3835001

[51] Int. Cl.$^5$ .................... H04B 3/46; G01R 31/02
[52] U.S. Cl. ..................................... 324/133; 379/6; 379/21; 324/555
[58] Field of Search .................. 379/6, 21, 24, 26, 29, 379/30; 324/133, 555, 73.11

[56] References Cited

U.S. PATENT DOCUMENTS

| | | |
|---|---|---|
| 3,870,950 | 3/1975 | Laass . |
| 3,872,384 | 3/1975 | Laass . |
| 4,039,937 | 8/1977 | Laass . |
| 4,163,937 | 8/1979 | Laass . |
| 4,323,738 | 4/1982 | Merrick .................. 379/21 |
| 4,496,801 | 1/1985 | Roberts .................. 379/6 |
| 4,691,336 | 9/1987 | Durston .................. 379/21 |

FOREIGN PATENT DOCUMENTS

| | | |
|---|---|---|
| 2320808 | 11/1974 | Fed. Rep. of Germany . |
| 2808869 | 9/1979 | Fed. Rep. of Germany . |
| 2703880 | 1/1980 | Fed. Rep. of Germany . |
| 2831865 | 2/1980 | Fed. Rep. of Germany . |
| 2853713 | 7/1980 | Fed. Rep. of Germany . |
| 3115498 | 2/1983 | Fed. Rep. of Germany . |

OTHER PUBLICATIONS

ELO-Junior Praxis: "Jubeltrompete", 1985, pp. 16 & 17.

*Primary Examiner*—Reinhard J. Eisenzopf
*Assistant Examiner*—Jose M. Solis
*Attorney, Agent, or Firm*—Frishauf, Holtz, Goodman & Woodward

[57] ABSTRACT

To permit checking or testing the condition of a network which may carry integrated services digital, the test apparatus includes a switch which has gauged switch terminals (S, U) to operate the apparatus in selective modes. The apparatus, further, includes a local battery and a protective network (C5, 12, D1, D2, K, TF, I, II) included in circuit with test terminals (P+, P—). The switch connects the audio frequency generator to the test terminals, to the local battery, and to the local audio tone reproducer for continuity testing; if the protective circuit includes a transformer, a-c is prevented from reaching the network. In another mode, to test transmission of audio frequency through the test terminals into the network, the switch connects the audio frequency generator to the test terminals and to the local battery, to energize the audio frequency generator. Propagation of externally generated audio frequencies can be tested by setting the switch means to connect the tone reproducer including an amplifier to the test terminals, while interrupting connection from the frequency generator to the tone reproducer, and to at least one test terminal.

17 Claims, 6 Drawing Sheets

TEST APPARATUS TO CHECK CONDITIONS AND CHARACTERISTICS OF POWER AND COMMUNICATION NETWORKS

BACKGROUND

Various types of networks, for example electrical networks and electrical connection lines used for communication purposes, for example telephone, telex, facsimile and the like, frequently have to be tested not only when running new lines, but also upon connection of additional substations or subscribers to the network. Routine testing should be necessary of such additional or new connections. Continuity testers are well known, in which an electrical connection between two measuring points can be tested. The continuity tester can also determine if one line extends from one test point to another test point and, further, if that line has an electrical connection to a third line or network. To test such lines, it has been known to use audio frequency generators and receivers. The audio frequency generator supplies electrical energy at an audio frequency, for short, an "audio frequency", into the network to be tested, for short the "check network". Use of an ordinary audio frequency receiver, connected to the check network, then permits obtaining information which lines or network portions have the particular audio frequency applied thereto. Galvanic connection between the audio frequency generator and the receiver is not necessary; inductive transmission, capacitative coupling, or intermediate amplifiers which, for example, may include opto-electronic couplers, can be used.

Test apparatus which include a continuity tester, an audio frequency generator and/or an audio frequency receiver are voluminous, heavy and expensive. Such apparatus, frequently, is not suitable for use at test locations which are not readily accessible. Known test apparatus, particularly if the lines are subject to possible stray connected energy, may be damaged, particularly when earphones are used, or sensitive electronic equipment is employed. The networks may, for example, be subject to voltage peaks and/or d-c energy components, inadvertently or erroneously applied to the networks, which may cause damage not only to the test apparatus but also to other apparatus which may be connected to the networks or may have been connected to the networks already before additional connections were made thereto.

THE INVENTION

It is an object to provide a test apparatus in which multiple test functions can be combined and which can provide output indications regarding conditions or characteristics of the checked network, which is simple, easily carried, and free from introducing electrical energy into networks of such level that damage could be caused.

Briefly, the apparatus has an audio frequency generator, and audio transducer, a local battery and test terminals for connection to the checked network. A switch is provided for selectively permitting interconnection of the respective elements to obtain multiple testing functions.

In accordance with a feature of the invention, the composite units of the test apparatus are so switched that circuit elements of one unit, for example of the frequency generator, is functionally used also in combination with another unit, for example the audio reproducer. The number of the overall necessary circuit components, thus, is substantially reduced. Consequently, the test apparatus not only becomes smaller and lighter, but also less subject to malfunction or disturbances, since there are fewer circuit components of the test apparatus which might fail.

Reducing the number of circuit components also permits use of higher quality individual components without raising the overall price of the apparatus.

In accordance with another feature of the invention, the test apparatus has a protective circuit therein which has a dual function, namely to protect the test apparatus from foreign voltages and currents, for example erroneously connected to the network to be tested or checked and, further, prevents introduction of disturbances into the network by the test apparatus itself. This network may be referred to as a "check network" although, strictly, it is a "to be checked" network.

In accordance with a preferred feature of the invention, one or two ganged switches are used to selectively control the various functions of the apparatus.

The protective circuit may, in accordance with a preferred feature of the invention, include inductive reactances connected between one, or both test terminals, to be connected to the network to be checked, and the further components of the test apparatus. This is particularly important if data transmission networks are to be tested since, then, upon connection of the test apparatus into the network, connection of stray voltage peaks or sudden high voltage values are effectively prevented. If the network is a data transmission network, handling information signals, such stray voltage peaks could be considered information signals by connected apparatus and lead to malfunction or erroneous data handling thereof. The inductances, further, result in low slopes of rising flanks of signals, so that connected equipment in the data transmission network to be checked can readily distinguish the signals introduced into the data transmission network by the testing apparatus from the signals coursing within the data transmission network itself.

Use of inductances as part of a protective network has the further advantage that, thereby, the network can be galvanically separated from the test apparatus, by using the inductances as part of a transformer. Preferably, a symmetrical transformer is being used.

DRAWING

Figure 1:
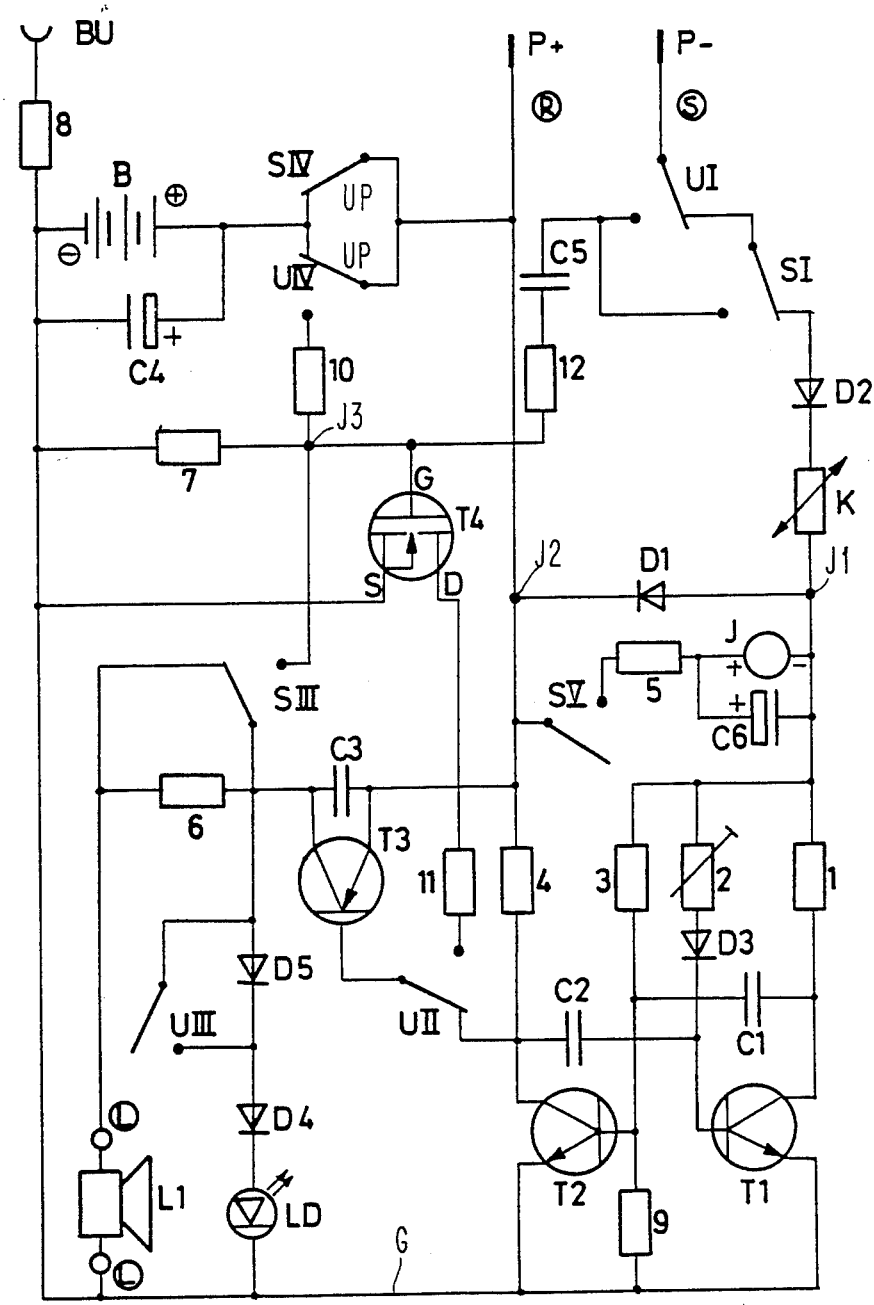
FIG. 1 is a schematic circuit diagram of the test apparatus, and illustrating two switches U and S in a position suitable for continuity testing.

In the drawings, Roman numerals adjacent the symbols S and U used in connection with the switches illustrate respective switch contacts of the switches S and U.

DETAILED DESCRIPTION

The circuit of FIG. 1 includes all circuit elements necessary to permit various testing steps, for testing respectively different characteristics or network conditions. These network conditions can be summarized as follows:

(a) to test if continuity through the checked network, i.e. the network to be checked or tested, exists between the terminals and, if so, the resistance of the network connected between the terminals;

(b) to test if the network will receive audio signals and to test transmission of audio signals through the test terminals into the checked network; and (c) to propagation through the test network of audio signals derived, for example, from a foreign source and fed into the network.

Two multi-terminal or multi-element switches S and U are provided. These switches permits not only connection or energization of the units but, additionally, selection of various testing modes. FIG. 1 illustrates the two switches in a first operated mode. If the switches are push-switches, they have two switched positions. Switches S and U can be operated independently. FIG. 1 illustrates the two switches in, for example, UP position. When both switches are in the UP position, the apparatus is connected or energized and the function "continuity test" has been selected.

A bushing BU is provided which permits connecting the test apparatus to chassis or ground, for example to the ground terminal of an outlet, or otherwise to ground, for example for safety reasons. Electrical connection is obtained from the terminal BU to the negative terminal of a battery B which, for example, is a primary battery. Thus, the positive terminal of battery B is connected via contacts S-IV and U-IV with a positive test terminal P+. It can be seen that upon operating the switches S and U to a "DOWN" position, the apparatus is disconnected since, then, the battery B is isolated from the terminals P+ and P−. An electrolytic capacitor C4 is connected across the battery.

The test terminal P+ is coupled to the test terminal P− via a diode D1. The cathode of diode D1 is connected to the terminal P+. The anode of the diode B1 is connected through a positive temperature coefficient (PTC) resistor K, and a diode D2 and switch terminals S-I and U-I to the test terminal P−. The diode D2 has a cathode connected through the PTC resistor K to the anode of diode D1.

A multivibrator circuit is connected across the terminals P+, P−, that is, in parallel to the diode D1. The multivibrator circuit has two transistors T1 and T2. The operating point of the transistors is adjusted or controlled by the resistors 1, 2, 3, 4 and 9 as well as by diode D3. Diode D3 so controls the operating point of the transistors that high resistance network lines connected to the test terminals P+ and P− still will cause operation of the multivibrator. These lines may, for example, have a connected resistance of 1.5 meg ohms. The frequency level of the tone generated by the multivibrator is, additionally, controlled and set by the capacitors C1, C2.

In detail, the multivibrator is so connected:

The collector of transistor T1 is connected through resistor 1 with the junction J1 between the PTC resistor K and diode D1. The emitter of transistor T1 is connected through an internal ground bus G to the negative terminal of the battery B. A series circuit formed by an adjustable resistor 2 and diode 3 is connected between junction J1 and the base of transistor T1, with the cathode of diode D3 connected to the transistor T1. The resistor 2 can be fixed but, preferably, is variable to set the operating point of the transistor T1.

The collector of transistor T2 is connected through resistor 4 to the junction J2 between the diode D1 and the positive test terminal P+. The emitter of transistor T2 likewise is connected to the ground bus, and hence to the negative terminal of the battery B. The base of transistor T2 is connected over resistor 9 with the ground bus G and, further, over resistor 3 to junction J1. The capacitor C1 is connected between the base of transistor T2 and the collector of transistor T1. Capacitor C2 is cross-connected between the collector of transistor T2 and the base of transistor T1.

The two transistors T1, T2 are npn transistors.

An audio transducer or loudspeaker L1 is connected to the ground bus G and to an amplifier formed by transistor T3 and associated circuitry. Transistor T3 is controlled by the multivibrator. Transistor T3 is a pnp transistor. Its emitter is connected directly to junction J2 and, hence, through switches S-IV and U-IV to the positive terminal of the battery B and, by connection of the junction J2, also to the test terminal P+. The collector of transistor G is connected to the anode of a diode D5 and, further, through resistor 6, to one terminal of loudspeaker L1. The resistor 6 is short-circuited by switch contacts S-III. The collector and emitter of transistor T3 are, respectively, connected through a capacitor C3. The base of transistor T3 is connected through contact or terminal U-II with the collector of the transistor T2.

FIG. 1 shows two receptacles L so that the loudspeaker L1 can be bridged by an external sound transducer, for example earphones. Disconnect switches for the loudspeaker and coupled to one or the other, or both of the receptacles L have been omitted since such connections are standard. A diode circuit including series connected diodes D5 and D4, with a serially connected light-emitting diode (LED) LD, is connected in parallel to the loudspeaker in advance of the resistor 6. The series circuit is so connected that the anode of diode D5 is connected to the collector of transistor T3, the cathode to the anode of diode D4, and its cathode to the anode of the LED LD, the cathode of which is connected to the ground bus G. Diode D5 can be short-circuited if the switch terminal U-III is closed. In the position of FIG. 1, it is open.

Operation, for testing circuit continuity, and/or resistance between the test terminals P+ and P−

Let it be assumed that a test is to be carried out if test terminals P+ and P− are connected through an external network, in other words, if an external network having two lines which, for example, are connected together at some point, are continuous. The actual test unit has receptacles or bushings marked R and S which, electrically, are formed by the terminals P+ and P−. If there is electrical connection between an external network connected to terminals P+ and P−, and the switches S and U are in the position shown, then the multivibrator is connected to the battery B via the externally connected checked network. A signal will be provided to the base of the transistor T3, which will render transistor T3 conductive, and voltage will be applied to the loudspeaker L1 and across the LED LD. The sound emitted from the loudspeaker and light from the LED is indicated both acoustically as well as optically, showing that there is an electrical connection between the terminals P+ and P−.

Light will be emitted from the LED LD even if the resistance between the test terminals P+ and P− rises up to about 600 kilo ohms. The tone signals derived from the loudspeaker L1 can be heard, in dependence on the selection and dimensioning of the respective components of the circuit up to resistance values between terminals P+ and P− of up to 1.5 meg ohms.

The resistance between the terminals P+ and P− can be determined by analyzing the frequency of the sound emitted from the loudspeaker L1, or a cross-connected earphone. First, terminals P+ and P− are short-circuited and a tone listened to. Upon connection of terminals P+ and P− to a network or a resistor having a resistance of 180 ohms, the frequency or pitch of the tone from the receiver L1 change by one octave; increasing the resistance to 1.5 kilo ohms causes change by a further octace. Change of resistance to 5 kilo ohms, 18 kilo ohms, 100 kilo ohms, 600 kilo ohms and 1.5 meg ohms causes rise in pitch or frequency of 3, 4, 5 and 6 octaves over the base frequency of the multi-vibrator when the test terminals P+ and P− are connected. It is, of course, also readily possible to provide an additional connecting switch between the test terminals P+ and P− which can be operated to provide a base reference during resistance or continuity measuring, to short-circuit the terminals P+, P− without disconnecting an external network.

The diodes D1, D2 and the PTC resistor K protect the multivibrator and the remainder of the network from external voltages or currents which may exist in the checked network connected to terminals P+, P−.

Figure 2:
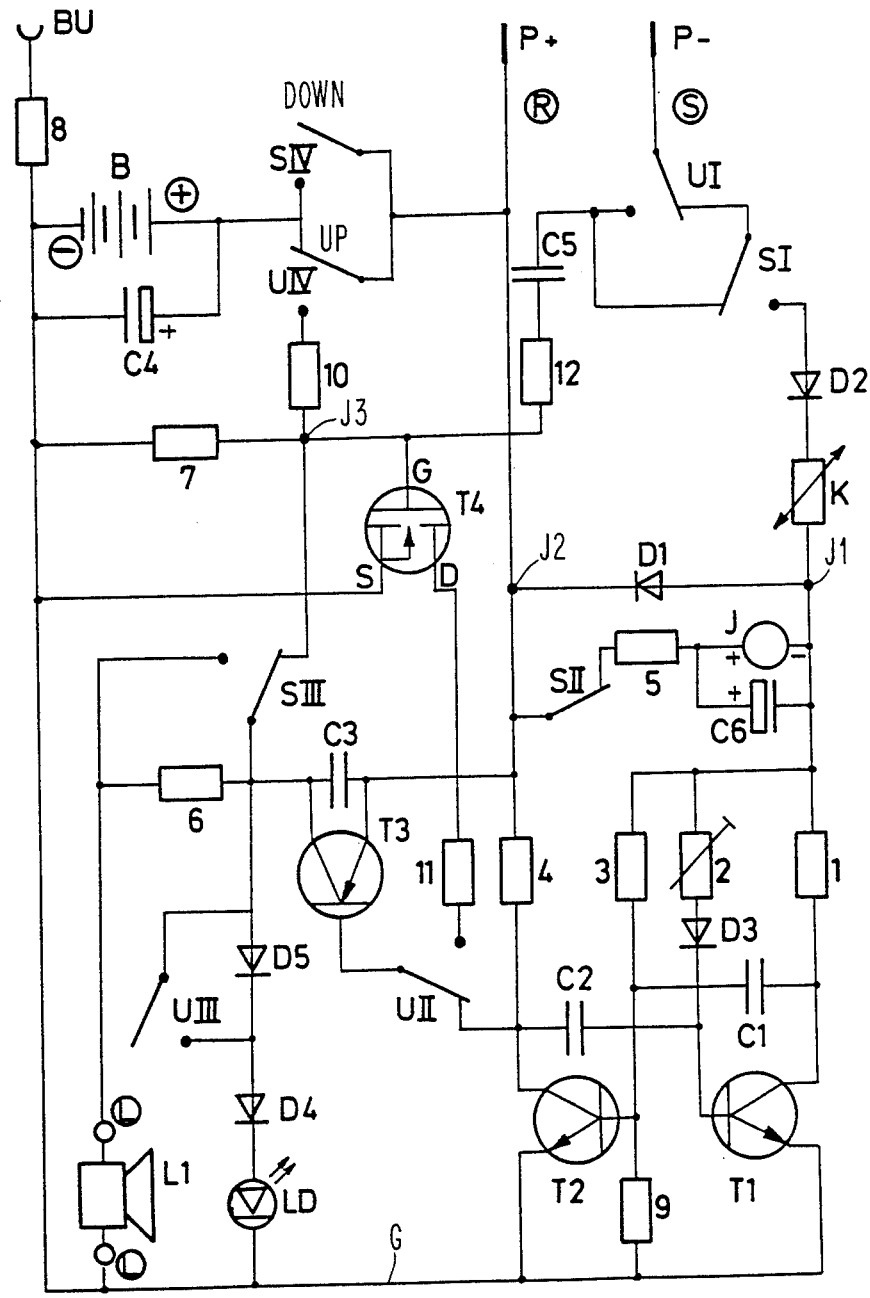
FIG. 2 is a circuit diagram of the apparatus of FIG. 1, in which the switches U and S are in a position suitable for use of the apparatus as a tone frequency transmitter.

Some networks should be tested for propagation of audio frequency signals therethrough. FIG. 2 illustrates the switch positions of the apparatus for such a test. Switch S is depressed into the DOWN position (see FIG. 1), whereas switch U is left in the UP position. The protective PTC resistor K and diode G2 are out of the circuit, since the connecting contact S-I is open. The capacitor C5 and the resistor 12 connect, through changed-over terminals S-I and U-I the test terminal P−, to a junction J3. Capacitor C5 is directly connected to the test terminal P−. Resistor 12, connected in series therewith, is connected via junction J3 and terminal S-III with the diode series circuit having the diodes D5, D4 and the LED LD. Further, junction J3 is connected over resistor 6 with the loudspeaker L1. Capacitor C5 and resistor 12 protect the apparatus from excessive voltage or voltage peaks, and thus protect the test apparatus from damage due to possible foreign voltages. Interference voltages from the network will, usually, be 50 or 60 Hz; the frequency of the multivibrator for this test will be at least 1000 Hz.

The terminal or contact S-V of the switch S is connected to a resistor 5. Resistor 5, in turn, is connected to a resistance element or, for short, a resistor, of repetitively oscillating changeable resistance value formed, for example, by an integrated network J. This changeable resistor J and resistor 5 are connected by swith S-V across the test terminals P+, P−. The resistor formed by the integrated circuit J, which has an electrolytic capacitor C6 connected thereacross, varies the frequency of the multivibrator in a specific characteristic manner, determined by the test apparatus. In effect, the frequency is being wobbled, so that the frequency generated, and hence the emitted tone, from the test apparatus can be clearly identified. This resistor, which wobbles the frequency, will hereafter be referred to as a "wobble resistor: or "wobbling resistor". In effect, the signal of the multivibrator is frequency-modulated, with a modulation frequency of from between 1 to 20 Hz The modulation frequency depends on the resistance value of the resistor 5 and the capacity of the capacitor C6.

The tone generated by the multivibrator can be monitored in the loudspeaker L1. The resistor 6, connected in circuit by the switch S-III, reduces the loudness level or volume of the loudspeaker L1. The LED LD indicates that the test apparatus is operating, and connected.

As can be clearly seen, by comparing FIGS. 1 and 2 and the foregoing description, most of the components of the test apparatus which are used when testing for continuity or resistance is also used when feeding a test frequency into the checked network. Only the PTC resistor K and diode D2 are not used; rather, the protective circuit C5—resistor 12 is connected, which were not in circuit for continuity testing (FIG. 1).

The transmission quality of networks can be determined by connecting the network to a selected frequency generator, for example another one of the apparatus in accordance with the present invention, or to an external frequency generator, feeding audio frequency energy into the test network. To determine if this fed-in frequency is properly transmitted, the circuit is placed into the position shown in FIG. 3.

The switch U is placed in the depressed or DOWN position, switch S is not operated and remains in the UP position. As can be seen, the multivibrator including the wobbling resistor J are out of circuit. Transistor T3, operating as an audio amplifier, has an auxiliary transistor T4 connected thereto by the switch terminal U-II. Transistor T4 is a field effect transistor (FET). The gate G is connected to a predetermined voltage by coupling to a voltage divider formed by resistors 7 and 10, connected across the battery B. Capacitor C5 and resistor 12 again are protective elements which connect the gate G with the terminal P−. The source terminal S of transistor T4 is connected to the negative terminal of battery B, that is, the ground bus G of the system which, also, is connected through protective resistor 8 to the ground bushing BU. The drain connection D of the FET T4 is connected over resistor 11, and switch contact U-III of the switch U to the base of transistor T3.

Figure 3:
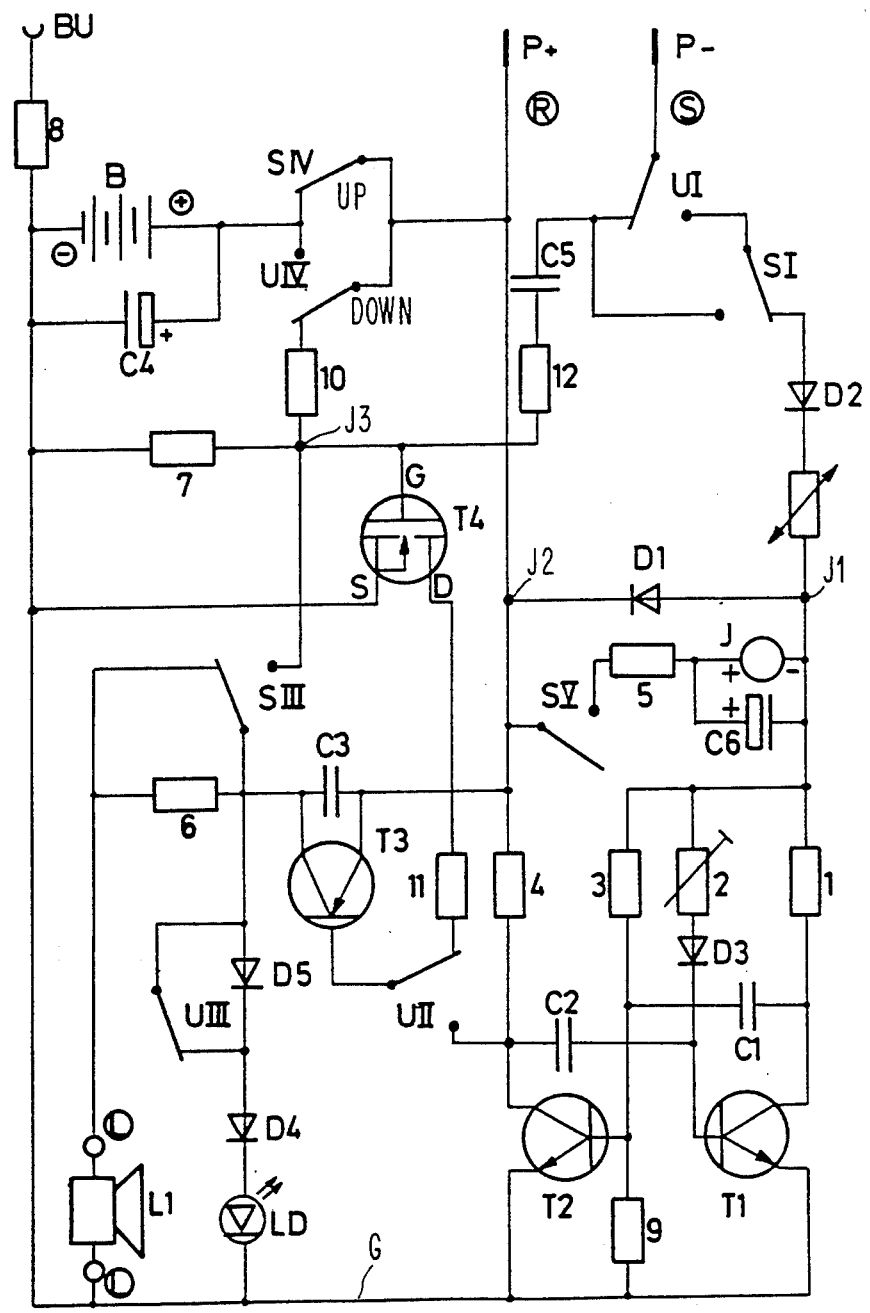
FIG. 3 is the circuit diagram in accordance with FIG. 1, in which the switches U and S are so placed that the apparatus can be used to check tone frequencies externally introduced into the network.

Operation, FIG. 3

Let it be assumed that a-c is applied on the test terminal P−, that is, a line has been found having a test signal frequency from an audio frequency generator thereon. Transistor T4 will become conductive, placing a voltage determined by the resistance of resistor 11 on the base of transistor T3. Transistor T3 will become operative, and will become conductive, so that a signal will be applied on the LED LD and, also, across the loudspeaker L1. The dropping resistor 6 is bridged by the contact S-III of the switch S. Thus, when a line has been found which carries the audio frequency, the loudspeaker L1 as well as the LED LD will respond. This provides for simultaneous acoustic and optical indication, and effectively eliminates erroneous perception or analysis of data.

Figure 4:
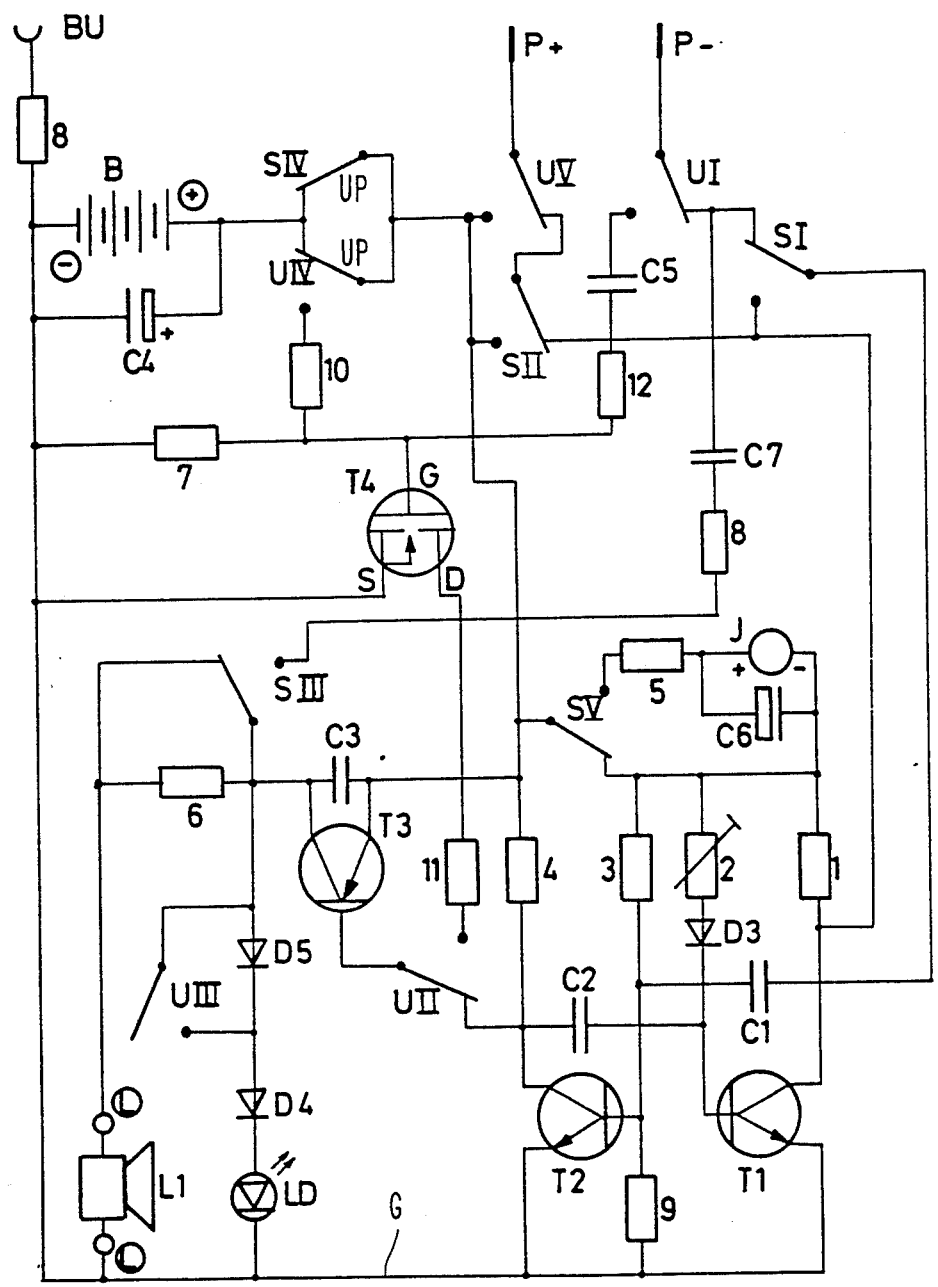
FIG. 4 is a circuit diagram of the network to test for continuity without d-c.

FIG. 4 illustrates an embodiment of the invention which is somewhat modified with respect to the embodiment of FIGS. 1-3. Similar elements have been given the same reference numerals, and will not be described again.

The difference between the two embodiments, basically, is this: Both test terminals P+, P— are connected over transfer contacts U-V and U-I of a five-terminal or five-pole switch U with the circuit of the test apparatus. In the position shown in FIG. 4, the switch U and the switch S which, also, is a five-pole or five-terminal switch, is in the operated or UP position, corresponding to the position shown in FIG. 1. The system, thus, is in the test mode appropriate for continuity testing.

The multivibrator. (the two transistors T1, T2, resistors 1, 2, 3, 4 and 9 as well as the two capacitors C1 and C2) is connected over terminal S-V of the switch S with the positive terminal of the battery B. Capacitor C1 is not directly connected to the resistor 1, and differing from the embodiment of FIG. 1, not to the collector of transistor T1. Rather, C1 is connected to the test terminal P— through the terminals S-I and U-I and to the test terminal P—. The test terminal P+ of the system is coupled to the resistor 1 and the collector of the transistor T1.

Operation

If the test terminals are coupled via a network or respectively, over short-circuited lines to be tested, a continuous path is present through the test terminals P+ and P—,and the multivibrator will oscillate. The loudspeaker L1 will provide sound. The frequency of the sound changes with the impedance of the external network connected between the test terminals P+ and P—. This circuit ensures that no d-c is fed into the external network connected to the terminals P+ and P—.

To use the system of FIG. 4 as an audio frequency transmitter, switch S is changed over to its non-operative or DOWN position. The terminals S-II to S-V of the switch are then in the position opposite that shown in FIG. 4. This switches over a first terminal of the capacitor C1, the other terminal of which is connected to the base of the transistor T2, to the resistor 1 and the collector of the transistor T1. The multivibrator now can oscillate and the wobbling resistor J provides a wobbled frequency output, as described above with reference to FIG. 2.

To protect the circuit components and the system with respect to stray or external voltages which may exist in the external network, a protective circuit including the capacitor C7 and resistor 8 is connected between the test terminal P— and the loudspeaker L1 and the parallel-connected LED LD.

To use the system as a receiver to determine if an externally introduced audio frequency is applied to the network, the switch S is changed in its activated or UP position. All terminals of the switch S will be in the position shown in FIG. 4, whereas the switch U is operated into its deactivated or DOWN position, so that the terminals of the switch U will be shifted to the not-illustrated position with respect to FIG. 4.

The operation of the apparatus and system then will correspond to that described in connection with FIG. 3.

To disconnect the apparatus entirely, both receiver and transmitter of the apparatus are disconnected by operating both switches U and S.

Figure 5:
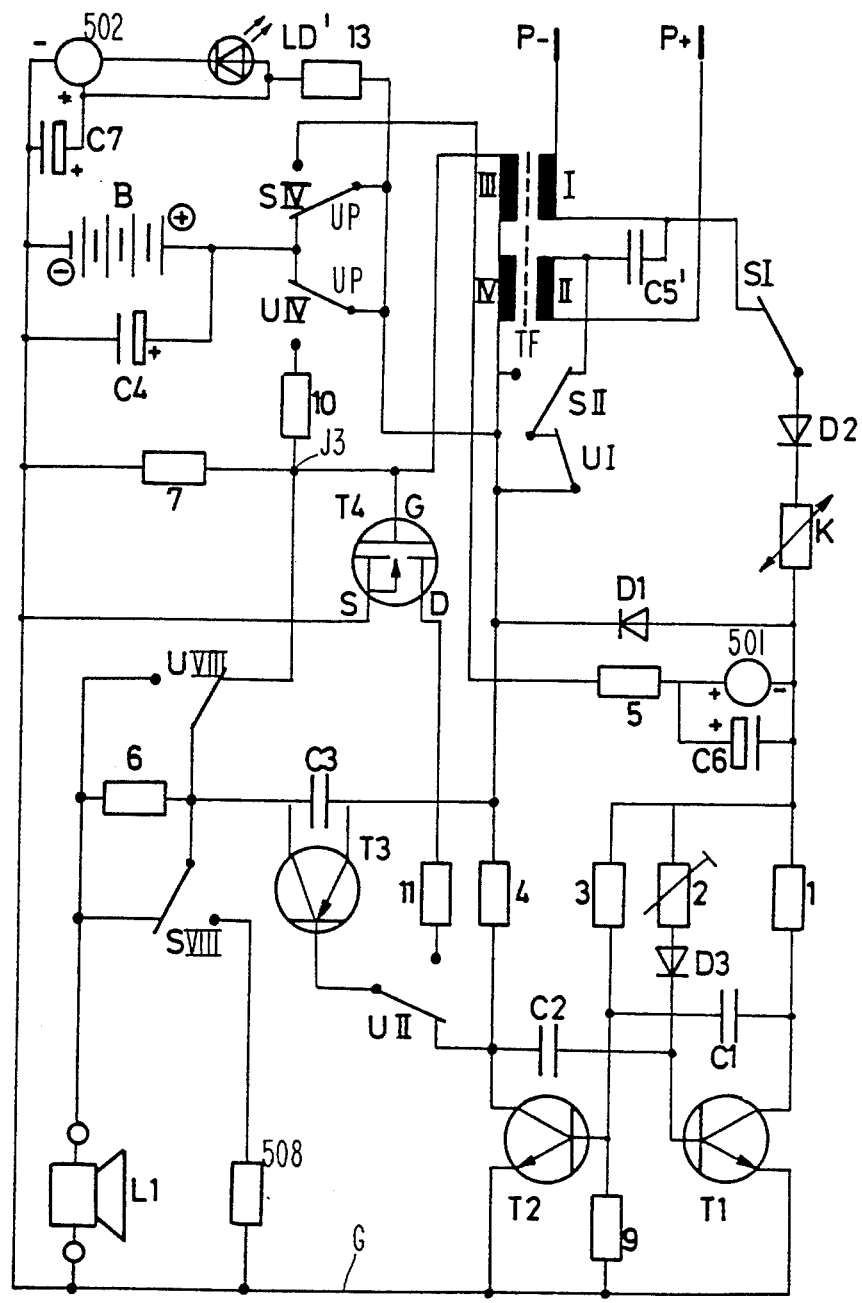
FIG. 5 is a circuit diagram of a test apparatus having a transformer in a protective circuit.

Embodiment of FIG. 5

The system of FIG. 5 corresponds essentially to that described in connection with FIGS. 1 to 4 and includes an inductive circuit to provide additional protection for the testing system as well as for connected networks.

FIG. 5 illustrates the circuit in which the switches S and U are in their operated, activated or UP position. When both switches are simultaneously brought into the opposite or unoperated DOWN position, the test apparatus and system is disconnected because connection to the positive terminal of the battery B is interrupted.

The system, in general, is similar to that described in connection with FIGS. 1 to 4. The basic difference is that the ground bushing BU has been omitted and the protective resistor 8 likewise is not used. A series circuit formed by a variable resistor 502, an LED LD', and a resistor 13 is connected through switch terminal S-IV in parallel to the battery B.

A capacitor, preferably an electrolytic capacitor C7 has its minus pole connected to the negative terminal of the battery B and hence to the ground bus G of the system. The LED LD' has its cathode connected to the output of the changeable resistor 502, and its anode through a resistor 13 to a junction J4. Junction J4 is also connected to the switch U-IV. The anode of LED LD' is connected to the positive terminal of the capacitor C7.

The series circuit formed by diodes D5, D4 and the LED LD, in parallel to the loudspeaker L1, is not needed and omitted from the embodiment of FIG. 5. The terminal S-IV, coupled to the junction between capacitor C3 and resistor 6 (FIG. 4), corresponding to terminal S-III of FIG. 1 is not needed. In its stead, the transfer terminals U-VIII are provided which, in the operated position shown, provide for connection to the resistor 10, the resistor 7 and the gate G of the preamplifier FET T4. If the switch U is changed over to its DOWN position, not shown in FIG. 5, the transfer contact U-VIII short-circuits the resistor 6.

The diode D1, as in the embodiment of FIGS. 1–4, is connected via the transfer terminals S-IV and U-IV with the positive terminal of the battery B. In addition, however, a connection over the windings III and IV of a transformer TF to the gate G of the preamplifier T4 is provided. The test terminal P— is connected through an inductance, namely the first winding I of the transformer TF and the transfer contact S-I with the diode D2 and with the PTC resistor K. The test terminal P+ is connected through a second winding II of the transformer TF and a second transfer switch contact S-II, and a first transfer switch U-I with the transfer switch contacts S-IV and U-IV. The ends of the windings I and II remote from the test terminals P— and P+ are cross-connected through a capacitor C5'.

Operation

Let it be assumed that the contacts S and U are operated, so that they will be in a position shown in FIG. 5. The series circuit formed by the variable resistor J2, the LED LD' and the resistor 13 now have voltage. The changeable resistor J2' changes its resistance in accordance with time, so that the LED LD' is, respectively, connected and disconnected and will flash. The changeable resistor J2', thus, together with the LED LD', acts as a flasher. This provides an indication that the system is connected and that the battery is draining. This is a simple way of showing the operator that the battery is loaded and, if the apparatus is not needed, the switches should be operated to disconnect the battery.

A resistor 8' is connected in parallel to the loudspeaker L1 and further connected to switch terminal S3. FIG. 5 illustrates the switch S in its operated position, and the resistor 508 is out of circuit.

Resistor 5, connected in series with the parallel circuit formed by the changeable resistor J501 and the capacitor C6 is connected to a terminal of the transfer switch portion S-IV of switch S. Resistor 13, in series with the parallel connection of the changeable resistor J2' and the LED LD',is connected through the switch S-IV to the battery B so that voltage is being applied thereto. In the position shown in FIG. 5, the changeable resistor J501 is out of circuit.

Operation

Upon connecting the switches S and U so that the respective terminals will be in the position shown in FIG. 5, the series circuit formed by the changeable resistor J502, the LED LD' and resistor 13 will have voltage. The changeable resistor changes its resistance with respect to time, so that the LED LD' will blink. This provides a visual indication that the apparatus is energized.

Let it be assumed that a continuity test of electrical lines connected to the test terminals P— and P+ is to be made. The two lines are then connected to the test terminals P+, P—. If the lines are continuous, the multi-vibrator formed by the transistors T1 and T2 and associated ciruit components is energized over the line to be tested with the battery B and will provide a signal to the base of the transistor T3, as previously described. Transistor T3 will become operative and voltage is applied to the loudspeaker L1. Transistor T3 then operates as an output amplifier for the loudspeaker L1. When an electrically conductive connection is present between the test terminals P+ and P—, the loudspeaker L1 will emit sound, and provides an acoustic monitor to determine if the lines connected between terminals P+ and P— are continuous. In the position of the switches shown in FIG. 5, thus, the system is suitable as a continuity tester.

The system is similarly suitable to provide test signals, that is, can be used as a frequency generator. The switch U is left in the position shown in FIG. 5, but, for such testing, switch S is changed over to the position not shown in FIG. 5, so that all its transfer switch elements will move into the opposite direction from that shown in FIG. 5.

When connected as a frequency generator, the windings I and II, cross-coupled via capacitor C5', are connected to the test terminals P— and P+. The signals derived from the multivibrator are transferred over the windings III and IV of the transformer TF to the windings I and II. The wobble or changing resistor J501 is connected in parallel to the multivibrator via the contacts S-IV, so that the multivibrator will be loaded with a periodically changing resistance and thus the output sound or tone or frequency from the multivibrator will be modulated.

As can be clearly seen in FIG. 5, the output frequency coupled from the circuit of FIG. 5 to the network is applied solely through the transformer TF to the check. No d-c voltages or currents are fed into the check since the windings I and II of the transformer TF are separated with respect to d-c by the capacitor C5'.

To use the apparatus as a frequency receiver, the switch S is moved again into the operated or UP position, and the switch U is moved into its non-operated or DOWN position, that is, the transfer terminals of the switch U will be switched in the position not shown in FIG. 5.

A-C signals received via the test terminals or test prongs P+, P— are transmitted via the first winding I and the second winding II on the third and fourth windings III and IV of the transformer TF, respectively, so that the preamplifier transistor T4 will be supplied with signals. When signals applied to the gate G of the FET T4 are applied, signals will be derived from the drain terminal D via resistor 11 and transfer contact U-II and applied to the base of the transistor T3. Transistor T3 now is energized, and signals will be applied to the loudspeaker L1 at full strength since the dropping resistor 6 is short-circuited by the transfer contact U-VIII. The loudspeaker L1 will respond and, when a signal is applied to the line P—, P+, will provide output sound, thus furnishing an acoustic indication as soon as a test frequency has been detected at the test terminals P+, P—.

Figure 6:
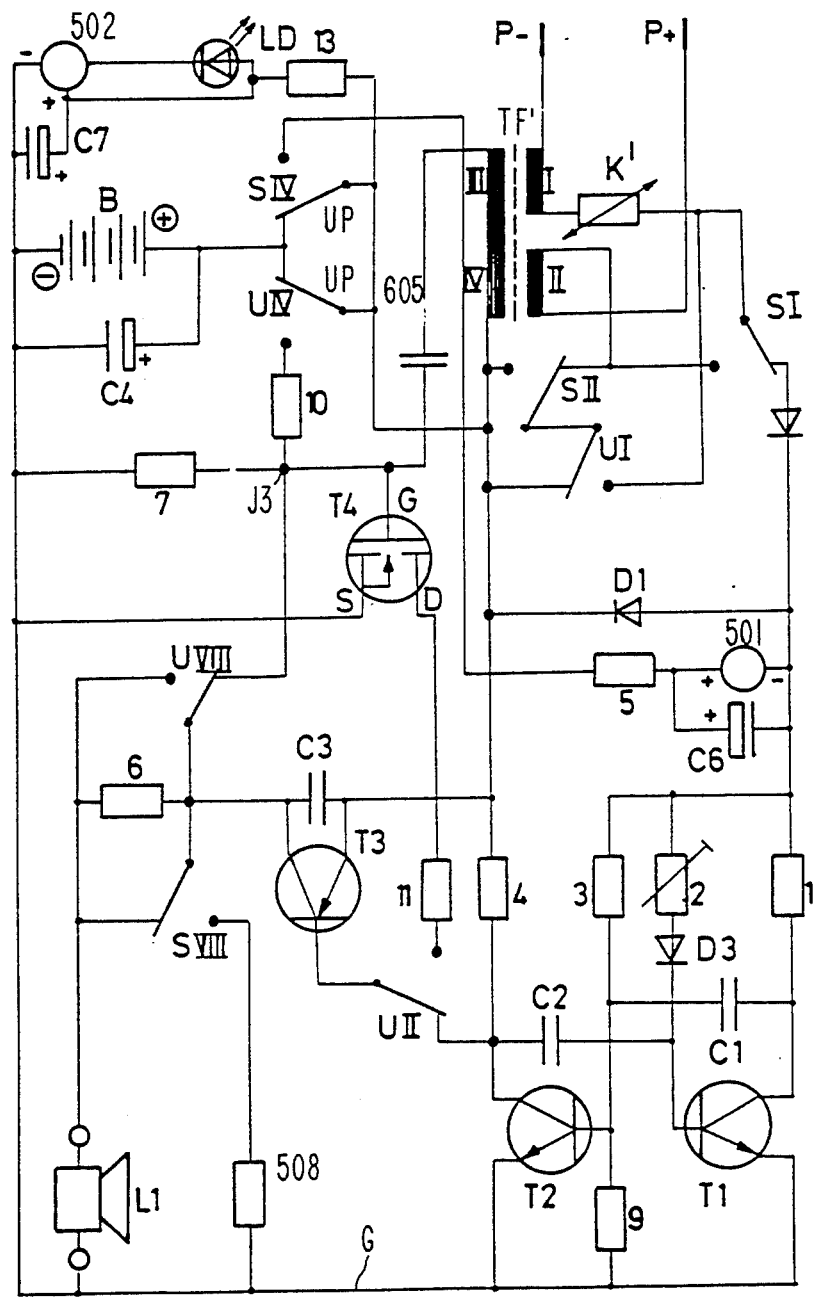
FIG. 6 is a circuit diagram of another embodiment of the test apparatus having a transformer.

Embodiment of FIG. 6

The apparatus and system of FIG. 6 is similar to that of FIG. 5, the major difference, however, being the transformer TF'.

The transformer TF' has individual windings I and II, each connected independently to the test terminals P—, P+, respectively. The system is decoupled with respect to direct current by interconnecting a capacitor C5" between the windings III and IV of the transformer U, rather than connecting the gate G of the preamplifier transistor T4 directly with the windings III, IV as in FIG. 5.

The windings III, IV of the transformer TF' may be a single winding, without a center tap, so that, basically, the transformer need have only three main windings.

A PTC resistor K' is connected between the first winding I of the transformer TF' and the switch terminal S-I. The PTC resistor K' should have a value which corresponds at least approximately to the permissible shunt resistance of the network to be tested, e.g. the minimum resistance thereof. The PTC resistor K (FIG. 5), changeable resistor J501 and the diode D2 are then not needed. The two windings associated with the test terminals P—, P+ of the transformer TF' are connected by the PTC resistor K' when the system is used to transmit a test frequency to an external network, the frequency being generated by the multivibrator of the test system. In operated position, to provide the test system, the transfer switch contacts of switch S are in positions different from those shown in FIG. 6. The PTC resistor K',thus, functions as a reflecting or balancing network output resistor in addition to its protective function.

The PTC resistor K' heats during operation and increases its resistance value as soon as it is connected to the check network through the terminals P—, P+. This protects the windings I and II against long-time high current flow therethrough and, additionally, the shunt effect of the lines to be tested, that is, the feedback to the multivibrator, is reduced. Upon transmission of test frequencies, the amplitude of the test frequency signals applied to the lines is reduced and possible interference or disturbance effect due to the test signals from the system of FIG. 6 being introduced into the check network is reduced.

Shifting the connection of the PTC resistor K' into the position shown in FIG. 6 with respect to the arrangement shown in FIGS. 1-5 still retains the protective function thereof in combination with the diode D2 when the system is used as a continuity tester. The switch positions of the transfer switches in FIG. 6 are so selected that the apparatus can also be used for continuity testing. The network to be tested, that is, the check network, as well as the testing system or apparatus, are thus protected, with respect to excessive currents, by the PTC resistor K'.

The PTC resistor is not heated if the lines of the network do not carry voltages, so that its damping effect on the frequency is small.

Operation, system of FIG. 6

The system of FIG. 6 can be operated in the three modes previously discussed.

For continuity testing, both switches U and S are placed in their operated or UP position, shown in FIG. 6. Electrical connection will be obtained from the test terminal P— through winding I of the transformer TF', PTC resistor K', terminal S-I and diode D2 to the multivibrator and the transistors T1, T2 thereof. The cathode of the diode D2 is coupled to the resistors 1, 2 and 3.

The test terminal P' is connected to the positive terminal of the battery B via winding II of the transformer TF', transfer contact S-II of the switch S, transfer contact U-I of the transfer switch U and the parallel terminals S-IV and U-IV. Upon forming an electrical connection in the lines of the network connected to the terminals P— and P+, the multivibrator will receive energy from the battery B. In the mode illustrated in FIG. 6, loudspeaker L1 is connected via terminals S3 and the transistor T3, as well as the transfer contact U-II to the output of the multivibrator.

The combined windings III, IV of the transformer TF' provide for coupling to the gate terminal G of the preamplifier transistor T4. Transistor T4 is not energized, however, since the associated drain electrode D does not have a connection to the transfer terminal of the switch portion U-II.

To provide output frequencies, the switch U is left in the operated or UP position shown in FIG. 6, and the switch S is brought in the quiescent or DOWN position, so that the movable blades or terminals or transfer terminals of the switch S are changed over to the opposite position, and not illustrated in FIG. 6.

With switch U in the operated or UP position, and switch S in the non-operated or DOWN position, electrical connection will be obtained from the test terminal P— via winding I of the transformer TF',the PTC resistor K', transfer contact S-I and over winding II of the transformer TF' to the test terminal P+. There is no galvanic connection between the network and the remaining components of the test apparatus. The drain electrode D of the transistor T4 remains unconnected, since only the terminals of the switch S were changed over. The transformer TF, however, is coupled over capacitor C5' with the output transistor T3. Resistor 8 is now connected over transfer contact S-VIII with the collector of the transistor T3 and provides a load resistor for transistor T3. Loudspeaker L1 is coupled via the coupling resistor 6 with the test apparatus, that is the tone will be damped. The operating resistance 508 is so dimensioned that sufficient voltage for transmission of test frequencies via the transformer TF' is provided, that is, a higher voltage than possibly needed only for continuity testing.

To check transmission of externally generated frequencies, the switch S is placed in the operated or UP position, as shown in FIG. 6, and the switch U is placed in the non-operated or DOWN position, contrary to the showing of FIG. 6.

External frequencies, connected to the test terminals P— and P+ are transferred from terminal P— over winding 1 of the transformer TF',the PTC resistor K', transfer contact U-I, transfer contact S-II and winding II of the transformer TF' to the test terminal P+.

The combined windings III and IV of the transformer TF' are now in parallel to the resistor 10 via transfer terminal U-IV, and thus at the input to the preamplifier transistor T4. The transfer switch section II of transfer switch U is in the position opposite to that shown in FIG. 6 and, the drain electrode D of the FET T4 is connected to the base of the power amplifier transistor T3. Transistor T4 operates as a preamplifier. The switch U-VIII likewise has transferred and short-circuits the resistor 6 so that the loudspeaker L1 forms the output resistor of the transistor T3 and amplifies at full power.

Any frequencies transmitted to the test terminals P—, P+ from the network thus are amplified and can be heard over the loudspeaker L1.

The multivibrator is conductively connected to the PTC resistor K' via t the transfer terminal S1 and the transfer terminal U1. Its output, however, is disconnected by change-over of the transfer switch U-II, so that the multivibrator is not operatively effective within the system.

The basic operation of the circuit corresponds, essentially, to that described in connection with FIG. 5.

Various changes and modifications may be made and any features described in connection with any one of the embodiments hereof may be used with any of the others. Specifically, the basic concept of using inductances, as described in connection with FIGS. 5 and 6, can also be used in connection with the embodiments of FIGS. 1-4, by connecting an inductance or a choke coil, respectively, in circuit with the test terminals P— and P+, for example in series, or as shown in FIGS. 5 and/or 6.

The inductances I, II ensure that pulses transmitted from the test system into the network to be tested or checked are provided thereto smoothly, with smoothly rising flanks of the pulses so that pulses in data processing and data analysis components connected to the network are not recognized by the connected components as information signals. The frequencies derived from the multivibrator, thus, are changed to supply, essentially, sinusoidal signals, in contrast to the sharp, effectively square-wave signals for data transmission.

The inductances can be integrated, physically, with test prongs. This additionally prevents transmission into the check network of possible high-frequency disturbance or interference signals which can be fed to the check network and/or to the test apparatus circuit by connecting lines between the test apparatus and the actual test prongs connected to the check network.

A suitable changeable resistor J, or J1',J2' is: A semiconductor device as U.S. Pat. No. 3,721,834. A suitable transformer, TF, or TF' is:

1:1:2 (1=0.1 H)

The circuit values of the multivibrator circuit T1, T2, 1, 2, 3, 4, 9, C1, C2 are, preferably, designed to provide a base frequency of: 3000 Hz when the test prongs P+, P— are short-circuited.

I claim:

1. Test apparatus to check or test the condition or network characteristics of electrical networks, selectively, for
continuity;
transmission characteristics;
signals thereon,
said test apparatus having
an audio frequency generator (T1, T2, 1–4, 9);
an audio reproducer (L1);
a local battery (B);
test terminals (P+, P−) for connection to the network to be checked or tested; and
switch means (S, U) for selectively interconnecting the test terminals and to the audio reproducer,
and wherein, in accordance with the invention,
the apparatus includes a protective circuit (C5, 12, D1, D2, K, TF, I, II) included in circuit with the test terminals (P+, P−), and at least one of: the tone generator, the audio reproducer;
an audio amplifier (T3, T4) coupled to the audio reproducer (L1, L); and
wherein
(a) if continuity through the network, when connected between the test terminals (P+, P−) is to be determined and, further, if continuity is established, the resistance between the test terminals is to be determined,
the switch means connect the audio frequency generator (T1, T2, 1–4, 9) to the test terminals (P1, P2),
the audio frequency generator to the local battery (B) to energize the audio frequency generator, and
the audio frequency generator to the audio reproducer,
whereby the audio frequency generator will operate at frequencies determined by the resistance of the network and, upon open circuit of the network, will be inoperative, and no tone will be reproduced;
(b) to test transmission of a-c frequencies through the test terminals (P+, P−) into the network,
the switch means (U, S) selectively connect the audio frequency generator (T1, T2, 1–4, 9) to the test terminals;
the audio frequency generator to the local battery (B) for energizing the audio frequency generator and to transmit audio frequencies into the network to permit monitoring of said audio frequencies transmitted into the network and to determine if the audio frequencies are propagated therethrough; and
(c) to test propagation through the test network of audio frequencies transmitted therein,
the switch means selectively connect the audio tone receiver including the amplifier to said test terminals (P1, P2), and interrupt connection from the frequency generator (T1, T2, 1–4, 9) to the tone receiver and to at least one test terminal.

2. The apparatus of claim 1, wherein the protective circuit includes at least one capacitor (C5) and a resistor (5).

3. The apparatus of claim 1, wherein the protective circuit includes at least one diode (D2) and a positive temperature coefficient (PTC) resistor (K).

4. The apparatus of claim 1, wherein the audio amplifier (T3, T4) includes at least one switch section or portion (SIII, UII) and an audio frequency preamplifier (T4),
the switch portion or section forming part of said switch means and, selectively, connecting the preamplifier in circuit with the audio amplifier and the audio reproducer.

5. The apparatus of claim 1, wherein the test terminals (P+, P−) are so connected to the switch means (S, U) that they are suitable for testing continuity, transmission of a-c frequencies through the test terminals into the network and to test propagation through the network of audio frequencies transmitted therein.

6. The apparatus of claim 5, wherein the switch means connect the audio frequency generator (T1, T2, 1–4, 9), and the switch means (S, U) and the local battery (B) are so interconnected that the audio frequency generator will be energized to oscillate only if at least one of the test terminals is connected to the network.

7. The apparatus of claim 6, wherein the audio frequency generator (T1, T2, 1–4, 9) is located in one of the test terminals.

8. The apparatus of claim 6, wherein the audio amplifier is located in one of the test terminals.

9. The apparatus of claim 6, wherein two test terminals (P+, P−) are provided, the audio frequency generator (T1, T2, 1–4, 9) being located and integrated in one of the test terminals and the audio amplifier (T3, T4) being located and integrated in the other one of the test terminals.

10. The apparatus of claim 1, wherein the audio reproducer comprises a loudspeaker (L1);
and wherein the apparatus includes earphone jacks (L) for connection of earphones to the apparatus.

11. The apparatus of claim 1, wherein the protective circuit includes an inductance (TF, I, II) selectively serially connected between the test terminals (P+, P−), the audio amplifier (T3, T4) and the audio frequency generator (T1, T2, 1–4, 9).

12. The apparatus of claim 11, wherein the inductance comprises a transformer (TF, TF′) having at least three windings (I, II; III, IV), a first winding (I) being serially connected with a first test terminal (P−);
a second winding (II) being serially connected with a second test terminal (P+);
and a third winding being coupled to said audio frequency generator (T1, T2, 1–4, 9) and to said audio amplifier (T3, T4) and to said switch means (S, U).

13. The apparatus of claim 12, wherein said protective network further includes a capacitor (C5′) connected across said first and second windings (I, II) at terminals thereof remote from said test terminals.

14. The apparatus of claim 13, wherein said protective (PTC) resistor (K) connected to the first winding (I) at the terminal thereof remote from said test terminal;
and wherein the switch means selectively connect said positive temperature coefficient resistor across said second winding (II) at a terminal thereof remote from the test terminal associated with said second winding.

15. The apparatus of claim 13, wherein the transformer includes four windings (I, II, III, IV), and wherein the third and fourth windings are inductively coupled, respectively, to the first and second windings, and are interconnected to form a galvanic connection.

16. The apparatus of claim 1, wherein, if continuity through the network connected between the test terminals (P+, P−) and, if continuity is established the resistance between the test terminals is to be determined, the switch means connect the transformer (TF, TF') in an output circuit of the audio frequency generator (T1, T2, 1-4, 9), and said first and second windings (1, 2) provide for coupling of audio frequency to the test terminals to provide for testing of continuity and resistance of the network without introducing direct current therein.

17. The apparatus of claim 1, further including a changeable resistor (J, J501, J502) coupled to and connected by said switch means to the audio frequency generator (T1, T2, 1-4, 9) when the switch means is connected to test transmission of a-c, frequencies through the test terminals (P+, P−) into the network to wobble the frequency of the audio frequency generator in a temporally undulating or oscillating manner to provide a characteristic frequency tone into the network.

* * * * *

UNITED STATES PATENT AND TRADEMARK OFFICE
CERTIFICATE OF CORRECTION

PATENT NO. : 4,947,110

DATED : August 7, 1990

INVENTOR(S) : H. HAASS

It is certified that error appears in the above-identified patent and that said Letters Patent is hereby corrected as shown below:

Column 14, claim 14, line 2, before "(PTC)", insert:

--network further includes a positive temperature coefficient--.

Title page, Abstract, line 3:

Change "gauged" to --ganged--.

Signed and Sealed this

Twenty-ninth Day of September, 1992

*Attest:*

DOUGLAS B. COMER

*Attesting Officer*  *Acting Commissioner of Patents and Trademarks*